United States Patent
Geraci et al.

(10) Patent No.: US 6,963,512 B2
(45) Date of Patent: Nov. 8, 2005

(54) AUTOTESTING METHOD OF A MEMORY CELL MATRIX, PARTICULARLY OF THE NON-VOLATILE TYPE

(75) Inventors: Antonino Geraci, Monza (IT); Alberto Campisi, Milan (IT); Lorenzo Bedarida, Vimercate (IT); Simone Bartoli, Cambiago (IT)

(73) Assignee: STMicroelectronics S.r.l., Agrate Brianza (IT)

(*) Notice: Subject to any disclaimer, the term of this patent is extended or adjusted under 35 U.S.C. 154(b) by 108 days.

(21) Appl. No.: 10/328,721

(22) Filed: Dec. 23, 2002

(65) Prior Publication Data

US 2003/0147293 A1 Aug. 7, 2003

(30) Foreign Application Priority Data

Dec. 28, 2001 (EP) .......................................... 01830832

(51) Int. Cl.$^7$ ............................................. G11C 29/00
(52) U.S. Cl. ............. 365/201; 365/189.07; 365/189.06; 365/185.09
(58) Field of Search ........................... 365/201, 185.09, 365/189.06, 189.07, 200

(56) References Cited

U.S. PATENT DOCUMENTS

| | | | |
|---|---|---|---|
| 5,528,553 A | * 6/1996 | Saxena | ................. 365/230.01 |
| 5,675,545 A | * 10/1997 | Madhavan et al. | ......... 365/201 |
| 6,014,336 A | 1/2000 | Powell et al. | |
| 6,026,505 A | 2/2000 | Hedberg et al. | |
| 6,032,274 A | 2/2000 | Manning | |
| 6,085,334 A | 7/2000 | Giles et al. | |
| 6,327,680 B1 | 12/2001 | Gervais et al. | |

FOREIGN PATENT DOCUMENTS

EP          01 83 0832          7/2002

* cited by examiner

*Primary Examiner*—Anh Phung
*Assistant Examiner*—Pho M. Luu
(74) *Attorney, Agent, or Firm*—Lisa K. Jorgenson; Bryan A. Santarelli; Graybeal Jackson Haley LLP

(57) ABSTRACT

An autotesting method of a cells matrix of a memory device includes the steps of reading the values contained in a plurality of the memory cells, comparing the read values with reference values, signaling mismatch of the read values with the reference values as an error situation, and storing the error situations. In the autotesting method, the reading, comparing, signaling, and storing steps are repeated for all the memory cells in a matrix column. The autotesting method further includes the steps of storing the positions of any columns having at least one error situation, and repeating all of the preceding steps for all the matrix columns.

41 Claims, 3 Drawing Sheets

AUTOTESTING METHOD OF A MEMORY CELL MATRIX, PARTICULARLY OF THE NON-VOLATILE TYPE

PRIORITY CLAIM

This application claims priority from European patent application No. 01830832.0, filed on Dec. 28, 2001, which is incorporated herein by reference.

TECHNICAL FIELD

The present invention relates generally to an autotesting method of a cells matrix of a memory device, in particular a non-volatile memory device.

The invention further relates to a memory device of the type which comprises at least one matrix of memory cells connected to a plurality of sense amplifiers that are adapted to issue values contained in said memory cells on an output bus.

The invention relates, particularly but not exclusively, to an autotesting method and an corresponding memory device having a autotesting architecture effective to detect memory locations where error situations occur in a non-volatile memory, the specification covering this field of application for convenience of illustration only.

BACKGROUND OF THE INVENTION

As is well known, the current strive to provide non-volatile memories of enhanced capacity brings about a problem of time necessary for testing the memories. Many of the operations for testing a memory that is comprised essentially of a matrix of memory cells involve scanning the whole matrix serially.

Testing the whole memory matrix is necessary, in particular, to find out potentially damaged memory locations and substitute them with redundant memory locations in order that the memory can be restored to full performance.

Consequently, the test step requires that a number of readings from each location in the memory matrix and a comparison of the result of each reading with a set of reference values, generally a predetermined pattern, be performed.

As a damaged memory location is detected, meaning that the value read from the memory location and the pattern value fail to match with each other, it is common practice to completely substitute a redundant column for the column that contains the faulty location.

The device employed to perform this comparison, hence the test, is known as the testing machine.

All the testing steps are currently timed by the testing machine and are carried out at slower rates than the memory device read rate in normal operation. The testing machine, in addition to supplying the signals that activate the read operations during the test, stores the results in an internal memory of its own, and then compares such results with a pattern stored in the machine in order to check for the presence of errors.

It can be appreciated, therefore, that the testing procedure and all the operations involved, generally referred to as the testing operations hereinafter, are dependent on the timing of the testing machine rather than the normally higher internal rates of the memory device.

It is to be noted that the testing machine timing is made longer by the presence of parasitic elements outside the memory device under test, specifically, parasitic elements residing in the hardware of the testing machine. These parasitic elements are present during tests that are carried out during the manufacturing process of the semiconductor wafer containing the memory device to be tested.

Also, the read parallelism compatible with the testing machine is limited by the number of outputs provided in the memory device being tested, rather than by the actual number of readings that can be effected simultaneously by the internal circuitry of the memory device.

U.S. Pat. No. 6,085,334 to Giles et al. discloses a method of testing and repairing an integrated memory, whereby faults induced by environmental conditions can be detected, the memory test being repeated under different conditions of operation. In particular, the Giles et al. method includes generating signals that are indicative of an error state of the memory under first and second conditions of operation, disagreement of the signals allowing faults due to environmental conditions to be detected.

The above-referenced document also discloses autotesting and autorepairing circuits that are incorporated in the semiconductor device where the memory is integrated and adapted to implement the claimed method.

An underlying technical problem solved by this invention is to provide an autotesting method of a matrix of memory cells and a corresponding memory device having a autotesting architecture, whereby the time required to complete the testing operations on the memory device can be reduced dramatically and the limitations with which prior testing machines and procedures are beset are overcome.

SUMMARY OF THE INVENTION

A principle on which this invention stands is one of having a part of the scanning step currently carried out by the testing machine inside the memory device, by storing the positions of those columns of a memory matrix where memory cells show to be damaged upon testing, and only substituting redundant columns for such columns after the whole of the memory matrix is scanned. The reading, comparing and error signalling operations provided by the testing procedure are synchronized by means of an appropriate internal clock signal of the memory device.

BRIEF DESCRIPTION OF THE DRAWINGS

The features and advantages of the autotesting method and the memory device with a autotesting architecture, according to this invention, will be apparent from the following description of embodiments thereof, given by way of non-limitative examples with reference to the accompanying drawings.

In the drawings.

DETAILED DESCRIPTION

Figure 1:
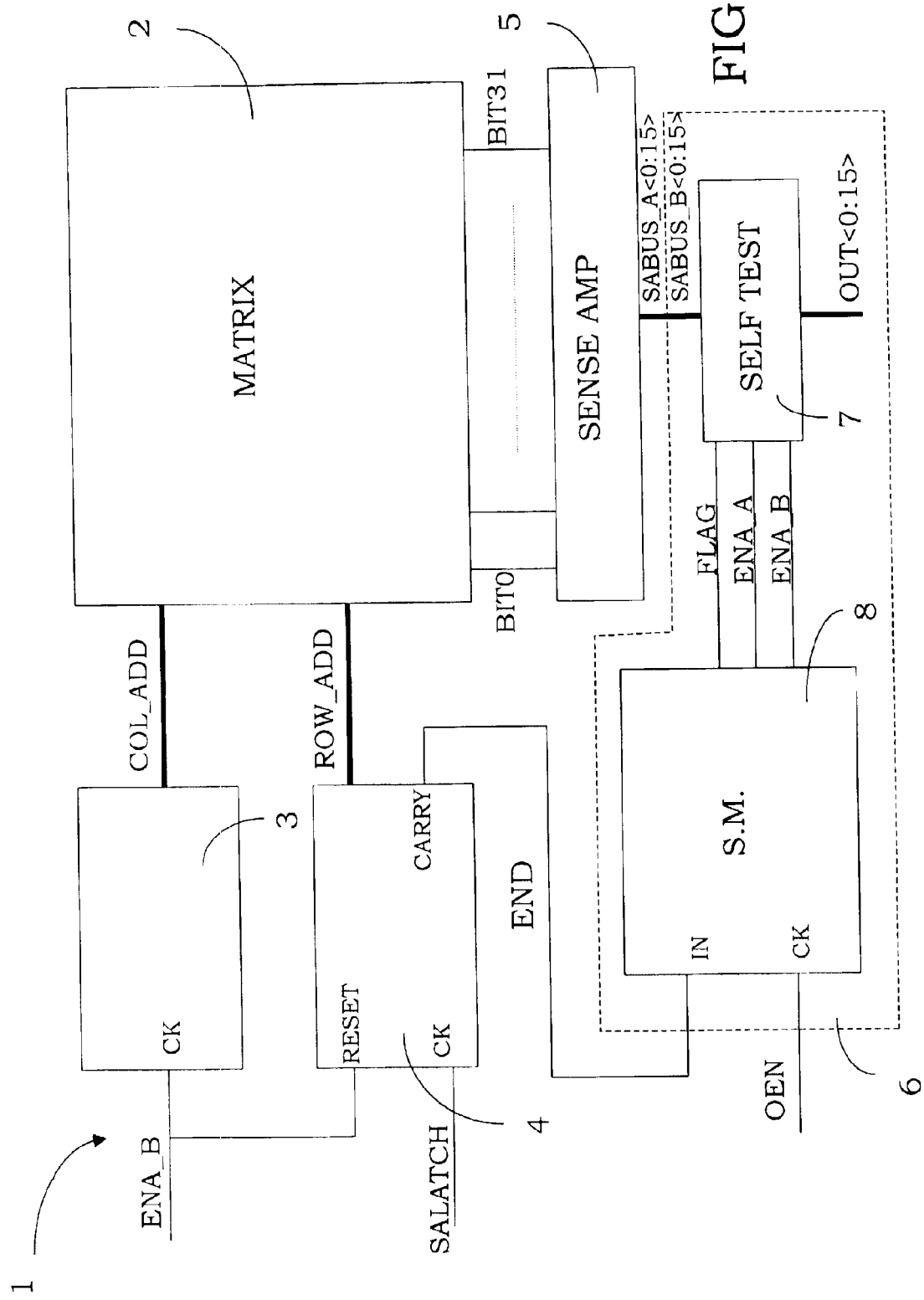
FIG. 1 shows schematically a memory device having an autotesting architecture according to an embodiment of the invention.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

In accordance with an embodiment of the invention, a autotesting method of an matrix of memory cells is provided, which method comprises the steps of: reading from a plurality of memory cells in the matrix, comparing the results of the reading step with a pattern of preset values so as to locate any memory cells that are in an error situation; and storing the error situations of the individual memory cells.

Advantageously, according to another embodiment of the invention, the autotesting method repeats the reading, comparing, and storing steps until the testing of all the memory columns is completed.

This autotesting method then continues with: a step of storing the positions of those columns which reveal at least one error situation, or faulty columns.

It should be noted that all the steps of the method indicated up to this point are carried out advantageously within the memory device, thereby improving the length of time taken to complete each step.

The autotesting method according to another embodiment of the invention, further comprises the following step, to be carried out after the whole memory matrix is scanned: substituting appropriate redundant columns for the faulty columns according to the stored positions.

This step of substituting the faulty columns is carried out conventionally on the testing machine, whose operating time will account only for a fraction of the time taken to test the whole device.

In other words, advantageously, the above embodiments of the autotesting method according to the embodiment of the invention shifts some of the operations for scanning and testing the matrix of memory cells inside the memory device, thereby reducing the time required to perform each operation. In particular, it is the memory device that will scan the whole matrix of memory cells on a row-by-row basis and suitably store the addresses of any faulty columns. The testing machine will then substitute them with redundant columns provided.

In particular, the reading and error checking steps are carried out by scanning a whole column, the result of reading from each location being, always stored in the same location of a suitable register of a memory device with an autotesting architecture to implement the autotesting method. Once the column is scanned, a logic value "1" is obtained if at least one memory location in the scanned column has different contents from the pattern of values used for comparison, and the column is signalled to be faulty.

It should be noted that in the autotesting method just described, the testing machine is operated conventionally, except that a new test algorithm is used in order to firstly read locations of a suitable register inside the matrix of memory cells to find out the positions of and substitute the faulty columns.

Advantageously according to an embodiment of the invention, the above autotesting method is implemented by means of a memory device that has a autotesting architecture comprising an matrix of memory cells and being operated in a test mode of its own.

As explained hereinafter, the memory device with a autotesting architecture according to this embodiment of the invention provides a simple manner of timing the reading operations performed inside the memory device through the whole matrix of memory cells, using, in particular, an internal clock signal of the memory device and an autotesting architecture.

In particular, the autotesting architecture of the memory device compares the results of the reading operations with a set of reference values (pattern) that are generated internally of the memory device, and outputs indications of faulty columns, if any, synchronously with the internal clock signal. Thus, at the end of the scan, the testing machine will substitute all the faulty columns located in the memory matrix using a standard redundancy procedure.

A memory device with a autotesting architecture is only to store the positions of fault-carrying columns, as obtained by reading from the autotesting architecture. The testing machine will then substitute appropriate redundant columns for the faulty ones.

Advantageously, a memory device with an autotesting architecture makes most use of systems and circuits that are already present in a memory device, suitably re-organized. This minimizes the area of silicon wafer required to fabricate the device.

In particular, a memory device with an autotesting architecture uses, to scan the addresses of each column, existing internal counters in conventional memory devices employed to handle modification algorithms, for example. In addition, a memory device with an autotesting architecture employs a number of sense amplifiers, which also exist in standard memory devices, to achieve maximum read parallelism, along with a state machine (SM) for handling the control signals.

As explained hereinafter, the memory device with an autotesting architecture comprises an autotesting architecture that can perform the operations for reading, comparing, and signalling any faults, in accordance with the embodiment of the autotesting method described above, all within the memory device.

With reference to the drawings, in particular to FIG. 1, a memory device with an autotesting architecture is shown generally at 1 in schematic form.

The device 1 comprises first and second counters 3 and 4 connected to a matrix 2 of memory cells, the first and second counters 3 and 4 respectively providing the matrix 2 with column (COL_ADD) and row (ROW_ADD) addresses.

In particular, the first counter 3 is a column counter receiving, on a clock input terminal (CK), a first enable signal ENA_B that is also connected to a reset terminal (RESET) of the second counter 4.

The second counter 4 is a row counter receiving, on another clock input terminal (CK), a read-end signal SALATCH.

In particular, the second, or row, counter 4 scans the addresses in the matrix 2 after a column is set. The scan is clocked by the read-end signal SALATCH used as a clock signal, so that, at the end of each reading, the second counter 4 counting the row addresses will count up, to start reading another addressed row.

The device 1 further comprises a plurality of sense amplifiers 5 connected to the matrix 2. The sense amplifiers 5 simultaneously read the binary values, BIT0:BIT31, contained in a plurality of memory locations of the matrix 2, and outputs the binary values on two output buses SABUS_A<0:15> and SABUS_B<0:15>.

In this way, each reading is performed in parallel on a maximum of bits, equal in number to the sense amplifiers 5 made available (32, in the instance shown).

Advantageously, according to an embodiment of the invention, the device 1 also comprises an autotesting architecture 7 connected to the sense amplifiers 5.

In particular, the autotesting architecture 7 is connected to the input terminals of the plurality of sense amplifiers 5 through the buses SABUS_A<0:15> and SABUS_B<0:15>, and has an output bus OUT<0:15> adapted to provide, implementing an autotesting method according to an embodiment of the invention, a plurality of result signals corresponding to the positions of columns where any error situations exist.

In particular, the autotesting architecture 7 performs, internally of the device 1, a comparison of the values read by the sense amplifiers 5 from the matrix 2 with a suitable set of reference values (pattern), storing any error conditions on the individual bits and supplying, on the output terminals OUT<0:15>, the positions associated with columns where at least one error situation exists.

The autotesting architecture 7, moreover, is connected to the input terminals of a state machine 8. This machine 8 receives, on a first input terminal IN, a scan-end signal END from the second or row counter 4 (presented to its carry terminal CARRY), and an external enable signal OEN, specifically a signal to enable the output buffers. Thus, SALATCH is the read-end signal as well as the clock signal to the second counter 4, whose carry signal is the scan-end signal END.

Both the autotesting architecture 7 and the state machine 8 substantially form a clocked autotesting system 6 inside the memory device 1.

The state machine 8 provides the autotesting architecture 7 with a second enable signal ENA_A, a flag signal FLAG, and the first enable signal ENA_B, the latter also being input to the column and row counters, 3 and 4. The external enable signal OEN substantially acts as a synchro signal to the state machine 8.

Figure 2:
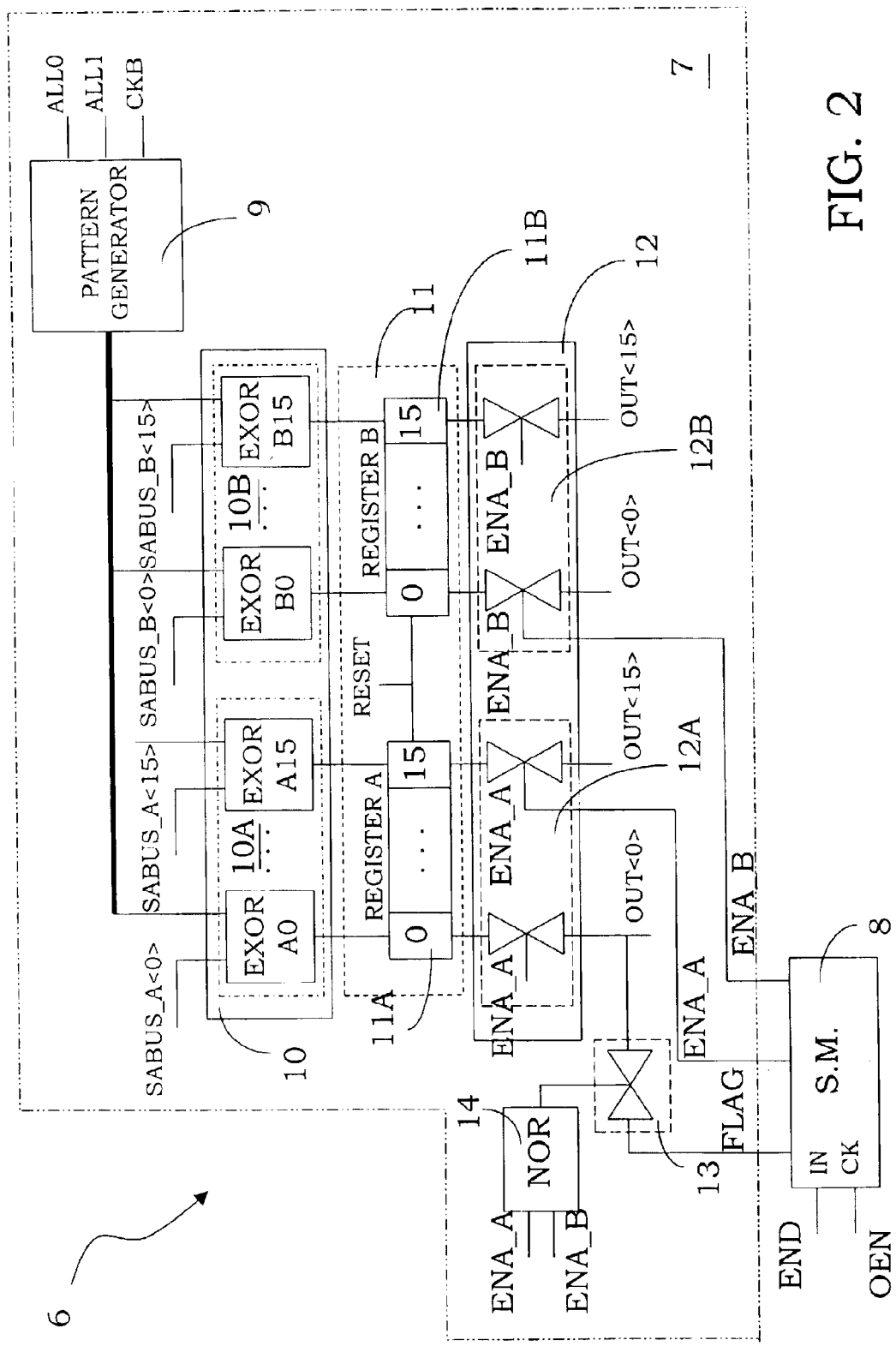
FIG. 2 is a detail view of the device shown in FIG. 1.

To perform the above sequence of operations, the autotesting architecture 7 has the internal structure shown schematically in FIG. 2 according to an embodiment of the invention. In particular, the autotesting architecture 7 comprises a reference value or pattern generator 9, which comprises inputs of a first signal ALL0, a second signal ALL1, and a third signal CKB, the latter to set the pattern generator 9.

In particular: the first signal ALL0 specifies testing a matrix of all values equal to 0, the second signal ALL1 specifies testing a matrix of all values equal to 1, and the third signal CKB (or CHECKERBOARD) specifies testing a matrix of alternating values of 0 and 1.

A bus connects the output of the pattern generator 9 to a compare block 10, which is in turn connected to the input side of the output buses SABUS_A<0:15> and SABUS_B<0:15> from the plurality of sense amplifiers 5.

In particular, the compare block 10 comprises a first plurality 10A and a second plurality 10B of exclusive-or (EXOR) logic gates (EXORA0 . . . EXORA15, EXORB0 . . . EXORB15) adapted to compare the values read from the memory matrix 2 and output by the sense amplifiers 5 on the buses SABUS_A<0:15> and SABUS_B<0:15> with the values in the compare pattern provided by the pattern generator 9.

It is to be noted that the structure of the compare block 10 is split symmetrically between two sub-blocks 10A and 10B, each adapted to process one half of the bits read from the matrix 2 through the sense amplifiers 5. The sub-blocks 10A and 10B receive the same reset signal (RESET). It should be noted that the sense amplifiers 5 provide, on the buses SABUS_A<0:15> and SABUS_B<0:15>, first and second halves of the data read synchronously by the autotesting architecture 7.

The reading operations performed by the sense amplifiers 5 and the comparing operations performed by the compare block 10 are controlled by said first and second enable signals ENA_B and ENA_A, and by the flag signal FLAG.

Advantageously, according to an embodiment of the invention, it, thus, becomes possible to use 16-bit registers for the following steps of storing and signalling error situations.

The output of the compare block 10 is connected to a memory register 11, which comprises first and second vectors 11A and 11B having input terminals connected to the output terminals of said first and second pluralities of EXOR logic gates, 10A and 10B.

Advantageously, according to an embodiment of the invention, the vectors 11A and 11B are used for storing the results of the compare operations performed by the EXOR logic gates of the compare block 10.

The total length of each vector 11A and 11B equals the number of bits read in parallel, as supplied from the sense amplifiers 5, which reflects a capacity equal to the largest number of outputs available (in this instance, 16 bits).

The autotesting architecture 7 scans a whole column in the matrix 2. At the end of the column scan, each bit in the register 11 will be a logic high (logic 1) if at least one bit in the scanned column has a different content from the reference value or pattern with which it has been compared by the EXOR logic gates of the compare block 10.

Furthermore, the autotesting architecture 7 comprises an output buffer 12, comprising first and second passgate blocks 12A and 12B that are enabled by the second and first enable signals ENA_A and ENA_B, respectively.

The passgates of the output buffer 12 are connected to the output terminals OUT<0:15> of the autotesting architecture 7, and provide it with the results, stored in the register 11, of the comparison effected by the compare block 10 upon a logic low signal (logic 0) of the external enable signal OEN.

To produce this synchronization of operations, the autotesting architecture 7 further comprises an enable passgate 13 connected between the state machine 8 and a first OUT<0> of the output terminals OUT<0:15>. The enable passgate 13 is itself enabled by the result of a logic comparison of the enable signals ENA_A and ENA_B, which comparison is effected by means of an enable logic gate 14, in particular of the NOR type.

The enable passgate 13 receives, as input, the flag signal FLAG and, if enabled by the enable logic gate 14, forces it to the first output terminal OUT<0>.

Finally, the state machine 8 receives, on an input terminal IN, the scan-end signal END, and on a clock terminal CK, the external enable signal OEN. The state machine 8 then provides the enable signals ENA-A, ENA-B and the flag signal FLAG to the autotesting architecture 7.

In other words, the memory device 1 with an autotesting architecture, timed according to the above-described embodiment of the invention, has a sequential section comprising the state machine 8 for interface handling, and a read and logic compare section comprising the EXOR gates and the registers of the autotesting architecture 7.

Figure 3:
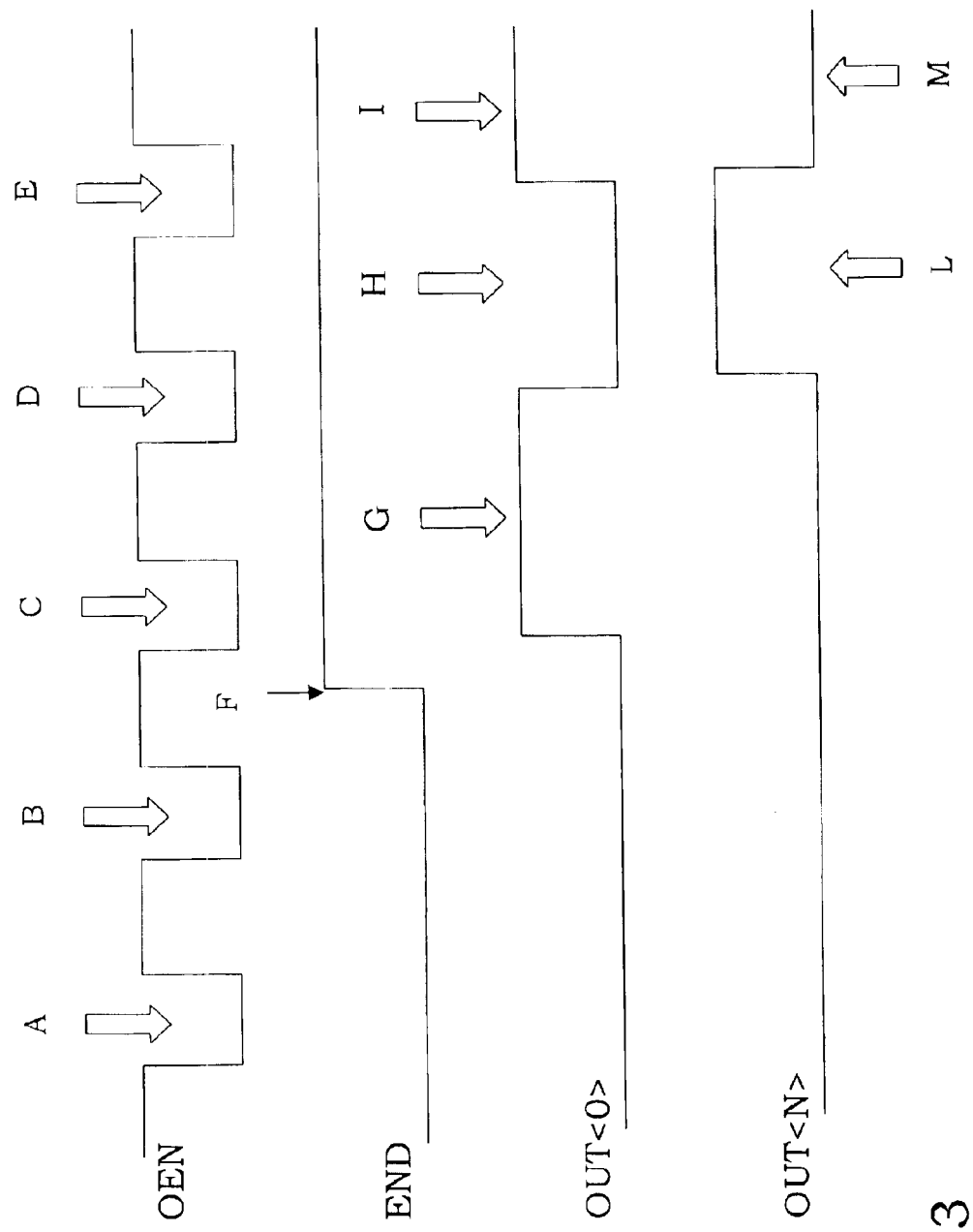
FIG. 3 shows a number of signals of the device of FIG. 2 plotted against time.

The operation of the memory device 1 with the autotesting architecture 7 according to an embodiment of the invention will now be described. Reference is made, for clarity, to FIG. 3 in which suitable signals present in the device 1 are shown plotted against time.

During a column scan in the matrix 2, a low logic level (logic 0) of the external enable signal OEN enables reading, on the output terminals OUT<0:15>, result signals that correspond to the positions of faulty columns (segment A of signal OEN in FIG. 3). This is the polling of the autotesting machine that reads from the memory device 1 at regular intervals.

It should be noted that, under this condition, a low logic value (logic 0) would be present on the first output terminal OUT<0> of the autotesting architecture 7 of the memory device 1.

At the end of a column scan, the scan-end signal END of the second row counter 4 goes to a high logic value (logic 1) and stops the count in the first column counter 3. At this point, the memory device 1 with the autotesting architecture 7 provides the value of the flag signal FLAG, equal to a high logic value (logic 1), on the first output terminal OUT<0>.

The testing machine acquires the contents of the register 11 with two successive read accesses to the output terminals OUT<0:15> of the memory device 1 with the autotesting architecture 7, the acquisition taking place sequentially at the first vector 11A and the second 11B.

The vector 11A, relating to the first half (16 bits) of the read bits, provides its values on the output terminals OUT<0:15> upon a first access to the memory device 1 with the autotesting architecture 7 triggered by the second enable signal ENA_A, which goes to a high logic value (logic 1).

Thereafter, the vector 11B, relating to the next half (16 bits) of the read bits, provides its values on the output terminals OUT<0:15> upon a second access to the memory device 1 with the autotesting architecture 7 triggered by the first enable signal ENA_B, which goes to a high logic value (logic 1).

FIG. 3 illustrates in particular the instance of an output terminal (e.g., a generic terminal OUT<N>) being signalled an error by the first vector 11A (first 16 bits) of the register 11, while another output terminal (e.g., the first OUT<0>) is signalled an error by the second vector 11B (next 16 bits) of the register 11.

The external enable signal OEN controls the read and verify cycles of the testing machine. During a column scan in the memory matrix 2, the scan-end signal END stays at a low logic level (logic 0). First and second scan cycles A and B of the output terminals OUT<0:15> by the testing machine, corresponding to segments where the external enable signal OEN goes to a low logic value (logic 0), cause a low logic value (logic 0) to be read on the first terminal OUT<0>, as forced by the flag signal FLAG supplied to the enable passgate 13 by the state machine 8.

At the end of a column scan, the scan-end signal END goes to a high logic level (logic 1) at a time F, and stops the scan.

A third scanning cycle C of the testing machine acquires a high logic level (logic 1) present on the first output terminal OUT<0> and corresponding to the value of the flag signal FLAG, as forced by the high logic level (logic 1) of the scan-end signal END (segment G).

At this point, the next two accesses to the register 11 allow the contents of the vectors 11A and 11B to be acquired sequentially.

In particular, a fourth scan cycle D with the external enable signal OEN at a low logic value (logic 0) and the third enable signal ENA_A at a high logic value (logic 1) allows the contents to be acquired of the first vector 11A, corresponding to the first half of the read bits (first 16 bits).

Likewise, a fifth scan cycle E with the external enable signal OEN at a low logic value (logic 0) and the first enable signal ENA_B at a high logic value (logic 1) allows the contents to be acquired of the second vector 11B, corresponding to the second half of the read bits (further 16 bits).

In the example of FIG. 3, the memory device 1 with the autotesting architecture 7 detects a normal situation, i.e., a low logic value (logic 0) corresponding to segment H, on the first output terminal OUT<0>, while the generic terminal OUT<N> has a high logic value (logic 1) corresponding to segment L, signaling the existence of an error situation on the generic terminal OUT<N> among the first 16 bits read.

Likewise, the memory device 1 with the autotesting architecture 7 detects a normal situation, i.e., a low logic value (logic 0) corresponding to segment M, on the generic output terminal OUT<N>, while the first terminal OUT<0> has a high logic value (logic 1) corresponding to segment I, signalling the existence of an error situation on such first terminal OUT<0> among the next 16 bits read.

With a further cycle of the external enable signal OEN at a low logic value (logic 0), the scanning of a following column by the autotesting architecture 7 can be started. In particular, the signal ENA_B increases the first column counter 3 and resets the second row counter 4 making the autotesting architecture 7 ready to scan another column.

Thus, with subsequent access cycles, the testing machine can read the results of the comparisons made by the autotesting architecture 7 column by column.

Advantageously, according to an embodiment of the invention, there is derived from the read-end signal SALATCH, through the second counter 4, the scan-end signal END, which signal functions as an internal clock of the memory device 1 and controls the scanning the whole matrix 2 made by the autotesting architecture 7. The testing machine is only to acquire the result, at its own times, and take account of the column count with a counter of its own, the counter counting up as the flag signal FLAG goes to a high logic level (logic 1).

In particular, the testing machine stores two items of information: which group of columns being analyzed, and the positions of the 1 bits, signalling error conditions, in the output register A or B.

With this information, the testing machine will be able to locate a faulty column and arrange for its substitution.

Using the autotesting method according to an embodiment of the invention, as implemented on the autotesting architecture 7, it becomes possible to save on the time for reading from the matrix 2. It can be readily seen that by denoting: Tm a minimum period that can be set by the testing machine and is compatible with ambient noise, Ti a period of an internal read cycle of the autotesting circuit 7, Nr and Nc the numbers of rows and columns in the matrix 2, and P a parallelism factor with which the internal readings can be performed with respect to those that the testing machine can perform, without the autotesting feature; a read time (Ttm) is arrived at, for a conventional testing operation, as follows:

$$Ttm = Nr*Nc*Tm.$$

Whereas, for the memory device 1 with the autotesting architecture 7 according to an embodiment of the invention, it can be seen that a read time (Tta) is given as:

$$Tta=Nc*(Nr*Ti+4Tm)/P$$

where, 4Tm accounts for the longest time taken by the testing machine to acquire the result of the scanned column.

Considering examples of the values actually used during the test and the parameters of actual devices, it is found that at the following example values:

Tm=500 ns; Ti=150 ns; Nr=256; Nc=128; P=2 the percent saving is:

Tta/Ttm=0.16, which protrudes an 84% (100−16) savings in testing time.

It should be further considered that, for a given testing time, the proposed memory device 1 with the autotesting architecture 7 allows testing machines with minimum cycles of longer duration to be used which, accordingly, are more cost-efficient.

What is claimed:

1. An autotesting method of a cells matrix of a memory device, characterized in that it comprises the steps of:
    reading said values contained in a plurality of said memory cells;
    comparing said read values with reference values;
    signaling mismatch of the read values with the reference values as an error situation; and
    storing said error situations;
said reading, comparing, signaling, and storing steps being repeated for all the memory cells in a column of said matrix; and the steps of:
    storing the positions of any columns having at least one error situation; and
    repeating all the preceding steps according to a step of scanning all said columns in said matrix;
all said steps being carried out inside said memory device.

2. An autotesting method according to claim 1, characterized in that it further comprises, at the end of said memory matrix scanning step, a step of:
    substituting suitable redundant columns for said columns having at least one error situation according to said stored column positions.

3. An autotesting method according to claim 2, characterized in that said step of substituting suitable redundant columns for said columns having at least one error situation in conformity with said stored column positions is carried out on a testing machine used for testing said memory device.

4. An autotesting method according to claim 1, characterized in that all said steps of reading values contained in a plurality of said memory cells, comparing said read values with reference values, signaling mismatch of said read and reference values as an error situation, storing said error situations, said storing step the positions of columns having at least one error situation, and repeating the preceding steps according to a step of scanning all said columns of said matrix are carried out by a autotesting architecture inside said memory device.

5. An autotesting method according to claim 1, characterized in that said error situations are stored into the same memory area of said memory device.

6. An autotesting method according to claim 5, characterized in that said a high logic value stored in said memory area is an indication of a column having at least one error situation.

7. A memory device, of the type which comprises at least one matrix of memory cells connected to a plurality of sense amplifiers adapted to output on output buses values contained in said memory cells, characterized in that it comprises an autotesting architecture connected between said output buses of said plurality of sense amplifiers and a plurality of output terminals of said memory device and adapted to compare said read values with corresponding reference values to locate and signal any mismatches as error situations on said plurality of output terminals.

8. A memory device with an autotesting architecture according to claim 7, characterized in that said autotesting architecture is clocked by an internal clock signal of said memory device and that said operations of comparison of said read values with said reference values, storing any error situations, and outputting results on said output terminals are carried out synchronously with said clock signal.

9. A memory device with an autotesting architecture according to claim 7, characterized in that said autotesting architecture comprises a compare block, a memory register, and an output buffer connected, in cascade together, between said output buses of said plurality of sense amplifiers and said output terminals of said memory device.

10. A memory device with an autotesting architecture according to claim 9, characterized in that said compare block is further connected to the input side of a generator generating said reference values.

11. A memory device with an autotesting architecture according to claim 9, characterized in that said compare block comprises essentially a plurality of logic gates having a first input terminal receiving said read values by said output buses of said plurality of sense amplifiers, a second reference terminal to receive said reference values, and an output terminal connected to said memory register.

12. A memory device with an autotesting architecture according to claim 11, characterized in that said compare block comprises first and second sub-blocks, with each sub-block comprising a sub-set of said plurality of logic gates.

13. A memory device with an autotesting architecture according to claim 12, characterized in that said memory register comprises first and second vectors connected to said first and second sub-blocks of said compare block.

14. A memory device with an autotesting architecture according to claim 13, characterized in that the total length of said first and second vectors is equal to a maximum number of bits that can be read in parallel by said plurality of sense amplifiers.

15. A memory device with an autotesting architecture according to claim 13, characterized in that said autotesting architecture provides sequentially on said output terminals values contained in said first and second vectors, on the occurrence of a second logic value (logic 1) of said first (ENA_B) and second enable signals.

16. A memory device with an autotesting architecture according to claim 11, characterized in that said memory register comprises a plurality of memory locations connected to said plurality of logic gates in said compare block, adapted to store values presented on said output terminals of said logic gates.

17. A memory device with an autotesting architecture according to claim 9, characterized in that said output buffer comprises a plurality of passgates connected between said memory register and said output terminals of said memory device and enabled by said first and second enable signals to present data from said memory register on said output terminals of said memory device.

18. A memory device with an autotesting architecture according to claim 17, characterized in that said output buffer comprises first and second blocks of said plurality of passgates, respectively connected to said first and second vectors of said memory register.

19. A memory device with an autotesting architecture according to claim 7, characterized in that said autotesting architecture is input first and second enable signals and a flag signal.

20. A memory device with an autotesting architecture according to claim 7, characterized in that said enable signals are generated by a state machine included in said memory device according to an external enable signal of said memory device.

21. A memory device with an autotesting architecture according to claim 20, characterized in that it further comprises an enable passgate connected between said state machine and a first of said output terminals, said enable passgate being enabled by means of a logic comparison of said first and second enable signals.

22. A memory device with an autotesting architecture according to claim 21, characterized in that said enable passgate further receives said flag signal also generated by said state machine to force it on said first output terminal once enabled.

23. A memory device with an autotesting architecture according to claim 20, characterized in that said state machine receives on an input terminal a scan-end signal used by said autotesting architecture as an internal clock signal and on a clock terminal said external enable signal.

24. A memory device with an autotesting architecture according to claim 23, characterized in that said scan-end signal is generated as a carry signal by a row counter of said memory device, said row counter receiving on a reset terminal said first enable signal, and on a clock terminal a read-end signal of said memory device.

25. A memory device with an autotesting architecture according to claim 23, characterized in that said external enable signal initiates successive cycles of reading from said memory cells, comparing and supplying results on said output terminals in order to effect a scanning of said matrix.

26. A memory device with an autotesting architecture according to claim 20, characterized in that a first logic level of said external enable signal enables a reading on said output terminals.

27. A method for testing of memory cells within a memory matrix, wherein the matrix comprises memory cells arranged in subsets of memory cells, the method comprising:

(a) reading a value stored in each memory cell in a first subset of memory cells and comparing each read value to a predetermined reference value;

(b) determining that a defect exists in the first subset if any read value does not match the corresponding reference value; and (c) storing in memory the location of the first subset of memory cells if it is determined that a defect exists.

28. The method of claim 27 further comprising repeating steps (a) through (c) for each subsequent subset of memory cells.

29. The method of claim 28, further comprising:

reading with an external testing machine the location of a subset of memory cells determined to have a defect; and replacing the subset of memory cells determined to have a defect with a redundant subset of memory cells.

30. The method of claim 27 wherein the first subset of memory cells comprises a single physical column in the matrix of memory cells.

31. The method of claim 27 wherein the memory matrix and the memory for storing the location of the first subset of memory cells if it is determined to have a defect comprise different memories.

32. The method of claim 27, further comprising storing the result of each comparison in a same memory location by overwriting the memory location with each result.

33. The method of claim 27 wherein the memory in which the location of the first subset is stored if the first subset is determined to have a defect is external to an integrated circuit on which the memory matrix is disposed.

34. A method, comprising:

reading a first memory location in a first row and a first column;

comparing the contents of the first memory location with a first predetermined value;

storing the result of the first comparison in a test location;

reading a second memory location in a second row and the first column;

comparing the contents of the first memory location with a second predetermined value;

storing the result of the second comparison in the test location; and replacing the first column with a redundant column if the contents of the test location indicate that the first column is defective.

35. The method of claim 34, further comprising:

storing the contents of the test location;

reading a subsequent memory location in a subsequent column; and comparing the contents of the subsequent memory location with a corresponding predetermined value; and replacing the first column with the redundant column after reading the subsequent memory location and comparing the contents of the subsequent memory location.

36. The method of claim 34 wherein storing the result of the second comparison comprises overwriting the test location with the result of the second comparison.

37. The method of claim 34 wherein the test location is disposed external to an integrated circuit that includes the first and second memory locations.

38. The method of claim 34 wherein replacing the first column comprises replacing the first column if the contents of the test location indicate that the contents of the first memory location do not equal the first predetermined value or that the contents of the second memory location do not equal the second predetermined value.

39. The method of claim 34 wherein the first and second memory locations each comprise a respective one-bit register.

40. A memory, comprising:

a matrix having columns of memory cells;

a pattern generator;

a comparator coupled to the matrix and the pattern generator and operable to compare the respective contents of each memory cell in one of the columns with a respective test value from the pattern generator; and a test location coupled to the comparator and operable to store a first value if the contents of each memory cells in the column equals the respective test value and to store a second value if the contents of at least one memory cell in the column does not equal the respective test value.

41. The memory of claim 40 wherein the comparator is operable to simultaneously compare the contents of multiple memory cells with respective test values.

* * * * *